(12) United States Patent
Stong et al.

(10) Patent No.: US 6,978,406 B2
(45) Date of Patent: Dec. 20, 2005

(54) SYSTEM AND METHOD FOR TESTING MEMORY ARRAYS

(75) Inventors: Gayvin E Stong, Fort Collins, CO (US); Jeffrey Thomas Robertson, Wellington, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 589 days.

(21) Appl. No.: 10/155,544

(22) Filed: May 24, 2002

(65) Prior Publication Data

US 2003/0221145 A1    Nov. 27, 2003

(51) Int. Cl.[7] .............................................. G11C 29/00
(52) U.S. Cl. .................................................... 714/718
(58) Field of Search ............................. 714/718, 719, 714/710, 726, 727, 729, 732, 733, 735, 736

(56) References Cited

U.S. PATENT DOCUMENTS

| | | | |
|---|---|---|---|
| 6,550,023 B1 * | 4/2003 | Brauch et al. | 714/42 |
| 6,574,762 B1 * | 6/2003 | Karimi et al. | 714/727 |
| 6,643,807 B1 * | 11/2003 | Heaslip et al. | 714/719 |
| 6,769,081 B1 * | 7/2004 | Parulkar | 714/733 |

* cited by examiner

Primary Examiner—Albert Decady
Assistant Examiner—James C. Kerveros

(57) ABSTRACT

A memory array test system and method provides for testing a memory array in a manufactured chip. In accordance with one aspect of the invention, a system includes memory test input logic that acquires test data via a data port, a memory test enable logic and a memory test output logic. In accordance with another aspect of the invention, a method acquires test data via a data port, writes the test data to a memory address in the memory array, and reads output data from the memory address in the memory array. Then, the method compares the test data and the output data to determine if the memory address in the memory array passes a test.

25 Claims, 5 Drawing Sheets

FIG. 4

SYSTEM AND METHOD FOR TESTING MEMORY ARRAYS

BACKGROUND OF THE INVENTION

1. Field of the Invention

The present invention is generally related to test circuitry, and, more particularly, to a system and method for testing memory arrays in circuitry.

2. Discussion of the Related Art

Integrated circuits (ICs) are electrical circuits comprising transistors, resistors, capacitors, and other components on a single semiconductor "chip" on which the components are interconnected to perform a variety of functions. Typical examples of ICs include, for example, microprocessors, programmable logic devices (PLDs), electrically erasable programmable read only memory (EEPROM) devices) random access memory (RAM) devices, operational amplifiers and voltage regulators. A circuit designer typically designs the IC by creating a circuit schematic indicating the electrical components and their interconnections. Often, designs are simulated by computer to verify functionality and to ensure that performance goals are satisfied.

In electrical device engineering, the design and analysis work involved in producing electronic devices is often performed using electronic computer-aided design (E-CAD) tools. As will be appreciated, electronic devices include analog, digital, mixed hardware, optical, electromechanical, and a variety of other electrical devices. The design and subsequent simulation of any circuit, very large scale integration (VLSI) chip, or other electrical device via E-CAD tools allows a circuit to be thoroughly tested and often eliminates the need for building a prototype. Thus, today's sophisticated E-CAD tools may enable the circuit manufacturer to go directly to the manufacturing stage without having to perform costly, time consuming prototyping.

In order to perform the simulation and analysis of a hardware device, E-CAD tools utilize an electronic representation of the hardware device. A "netlist" is one common representation of a hardware device that includes the circuit. As will be appreciated by those skilled in the art of hardware device design, a "netlist" is a detailed circuit specification used by logic synthesizers, circuit simulators and other circuit design optimization tools. A netlist typically comprises a list of circuit components and the interconnections between those components.

The two forms of a netlist are the flat netlist and the hierarchical netlist. Often, a netlist will contain a number of circuit "modules," which are used repetitively throughout the larger circuit. A flat netlist will contain multiple copies of the circuit modules essentially containing no boundary differentiation between the circuit modules and other components in the device. By way of analogy, one graphical representation of a flat netlist is the schematic of the circuit device.

In contrast, a hierarchical netlist maintains only one copy of a circuit module, which may be used in multiple locations. By way of analogy, one graphical representation of a hierarchical netlist shows the basic and/or non-repetitive devices in schematic form and the more complex and/or repetitive circuit modules are represented by "black boxes." As will be appreciated by those skilled in the art, a "black box" is a system or component where the inputs, outputs, and general function are known, but the contents of which are not shown. These "black box" representations, hereinafter called "modules," mask the complexities therein, typically showing only input/output ports.

An IC design can be represented at different levels of abstraction, such as at the register-transfer level (RTL) and at the logic level, using a hardware description language (HDL). VHDL® and Verilog® are examples of HDL languages. At any abstraction level, an IC design is specified using behavioral or structural descriptions, or a mix of both. At the logical level, the behavioral description is specified using Boolean equations. The structural description is represented as a netlist of primitive cells. Examples of primitive cells are, among others, full-adders, logic gates, latches, and flip-flops.

Set forth above is some very basic information regarding integrated circuits and other circuit schematics that are represented in netlists. Systems are presently known that use the information provided in netlists to evaluate circuit timing and other related parameters. More specifically, systems are known that perform a timing analysis of circuits using netlist files. Although the operational specifics may vary from system to system, such systems generally operate by identifying certain critical timing paths, then evaluating the circuit to determine whether timing violations may occur through the critical paths. As is known, timing specifications may be provided to such systems by way of a configuration file.

While there is extensive testing of designs of electronic devices in the design phase, there is also a need for testing of electronic devices after manufacture to eliminate devices having manufacturing flaws. Currently, memory arrays are tested by adding self-test circuitry which requires many additional gates or by bringing the input and outputs out to the device pins, or by wrapping test circuitry around the memory array.

Thus, a heretofore unaddressed need exists in the industry to address the aforementioned and/or other deficiencies and inadequacies.

SUMMARY OF THE INVENTION

The present invention provides chip analyzer systems and methods for testing memory arrays in circuitry. Briefly described, in architecture, one embodiment of the system includes a memory test input logic that acquires test data via a data port, a memory test enable logic and a memory test output logic.

The invention can also be viewed as providing one or more methods for testing memory arrays in circuitry. In this regard, one such method can be summarized by the following steps: (1); acquiring test data via a data port; (2) writing the test data to a memory address in the memory array; (3) reading output data from the memory address in the memory array; and (4) comparing the test data and the output data to determine if the memory address in the memory array passes a test.

DESCRIPTION OF THE DRAWINGS

The accompanying drawings incorporated in and forming a part of the specification, illustrate several aspects of the present invention, and together with the description serve to explain the principles of the invention. In the drawings.

DETAILED DESCRIPTION

Having summarized various aspects of the present invention, the invention will now be described in detail with reference to the drawings. While the invention will be described in connection with these drawings, there is no intent to limit it to the embodiment or embodiments disclosed therein. On the contrary, the intent is to cover all alternatives, modifications and equivalents included within the spirit and scope of the invention as protected by the appended claims.

As will be described in detail, systems and methods of the invention provide a methodology for testing memory arrays, such as for example but not limited to, latch-arrays, RAM cells and content addressable memory. A latch-array is a memory structure comprising latches arranged in a given word width with a given number of entries.

In order to make the memory array testable, memory test logic has been added to the standard memory array configuration. The first logic addition is a memory test input circuit to control the input data, which is added to an existing input latch which prevents a race condition from occurring in the memory array. The next logic addition is the memory test enable circuit that controls the enabling of write commands into the memory array. This memory test enable circuit is added so that a design tester can control when data is written into the memory array. The third addition is a memory test output circuit that captures the data being output from the memory array. These memory test circuits enable input and output circuits around the memory array to be tested, in addition to the memory array.

Moreover, these memory test circuits enable logic external to the memory array to be tested as well. By setting a chip test signal, a design tester can use the memory test output circuit to control the data that drives logic external to the memory array so that the external logic may be tested. The memory test input circuit captures data coming from the rest of the chip. This enables the remaining portions of an integrated circuit to treat the memory array as a black box for testing.

In an alternative embodiment, the memory test logic of the present invention can test the speed of a memory array. In order to test the speed of the memory array, the design tester controls the data input, the write and read addresses and a bypass signal. The memory test enable circuit controls the write enable. The write and read addresses, and the data input are controlled on the first step of multiple clock cycles, where the write enable is controlled during all of the clock cycles. The write and read addresses and input data are controlled by tracing back through the logic that feeds the signals into the memory array and setting up the input registers to that logic. A speed test of the data output is performed and the output data is captured in circuitry down stream from the memory array.

Figure 1:
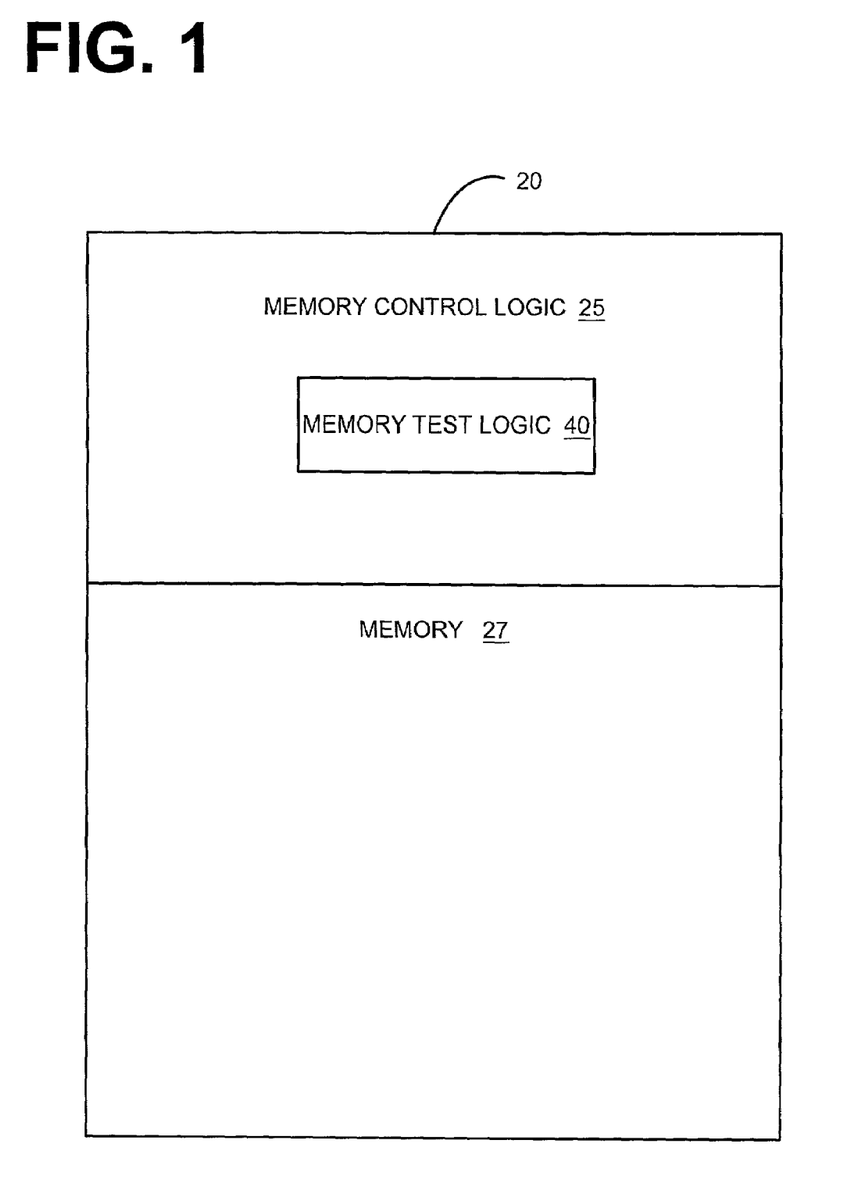
FIG. 1 is a block diagram illustrating a possible implementation of the components of the memory test logic of the present invention.

FIG. 1 is a block diagram illustrating one possible implementation of the components of the memory test logic 40 of the present invention in a circuitry 20. The circuitry 20 includes a memory control logic 25 and memory 27. The memory test logic 40 resides within the memory control logic 25. The memory test logic 40 includes logic to enable a design tester to validate the circuitry 20 for manufacturing defects. The memory test logic 40 is herein described in further detail with regard to FIGS. 2, 3A, and 3B. The circuitry 20 includes, for example but not limited to, one or more of the following types of memory: a random access memory, a queue, a stack, a read only memory, an erasable programmable read only memory and a portable compact disk read only memory.

Figure 2:
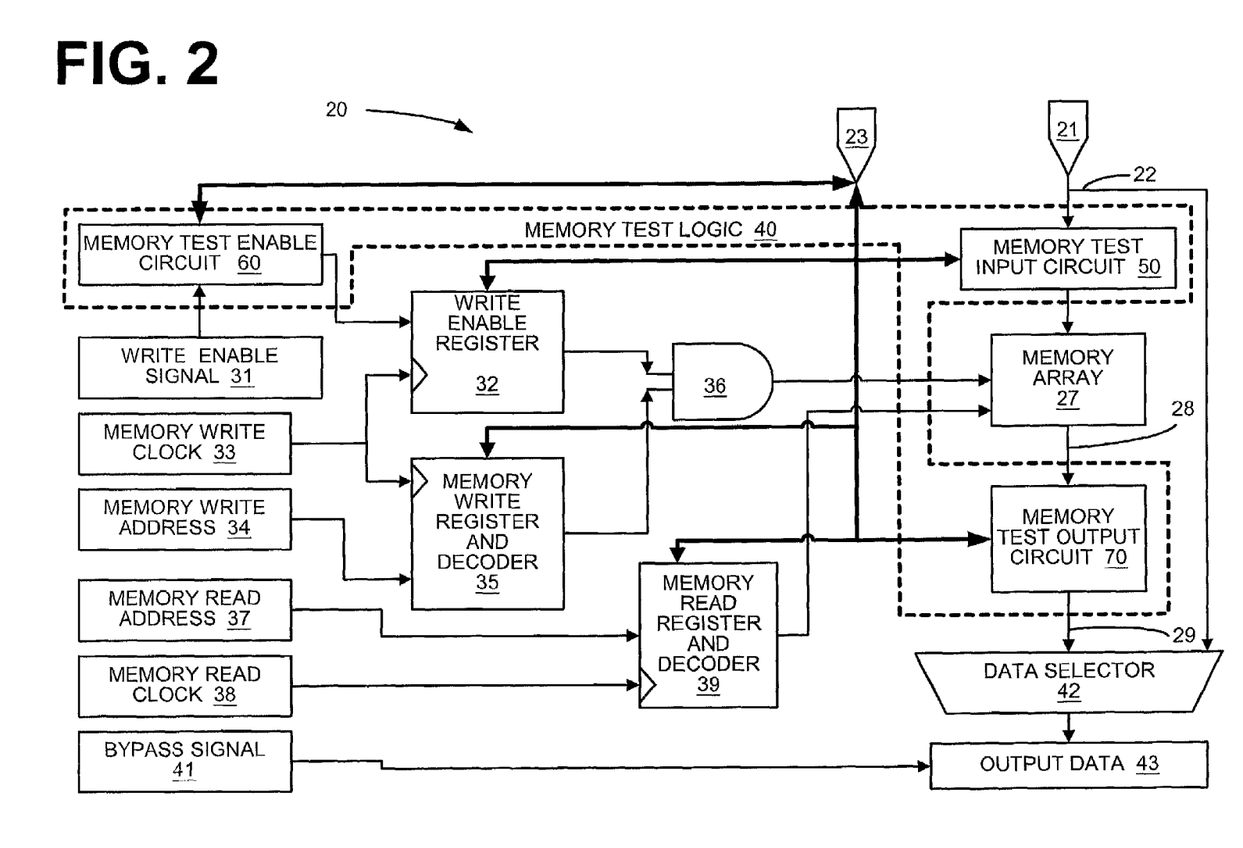
FIG. 2 is a block diagram illustrating an example of the memory test logic utilized by the memory test analyzer of the present invention as shown in FIG. 1.

FIG. 2 is a block diagram illustrating an example of the memory test logic 40 in a circuitry 20, as shown in FIG. 1. Contained within the memory test logic 40 are the memory test input circuit 50, memory test enable circuit 60, and memory test output circuit 70. Also in circuitry 20 is circuit input port 21 that allows for data input to memory array 27. The additional logic on circuitry 20 includes the memory control logic 25 (FIG. 1) including circuitry 31–39 for the read and write control of memory array 27, and circuitry 41–42 for data output.

The circuitry 20 also includes a circuit input port 21 and a test port 23. The circuit input port 21 allows for data to be input from outside of circuitry 20. This data is input into the memory test input circuit 50. The memory test input circuit 50 can be, for example, but not limited to, any kind of scannable input register or latch. Data input to the memory test input circuit 50 is input into memory array 27.

The test port 23 is a bidirectional connection to the write enable register 32, memory write register and decoder 35, memory read register and decoder 39, memory test input circuit 50, memory test enable circuit 60 and memory test output circuit 70. The test port 23 allows for data to be input to circuitry 20 from logic outside of circuitry 20. The test port 23 also allows for data to be output from circuitry 20 to logic outside of circuitry 20. The test port 23 can be connected in either serial or parallel modes depending on design requirements.

Figure 3A:
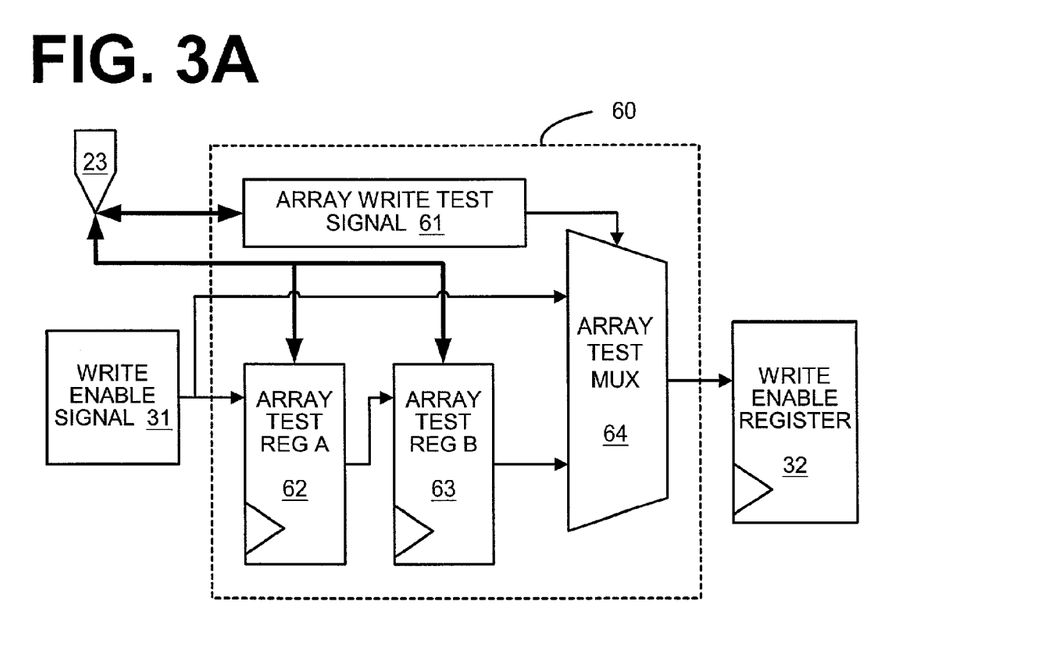
FIG. 3A is a block diagram illustrating an example of the memory test enable circuit within the memory test logic of the present invention as shown in FIG. 2.

The data can be written upon the receipt of proper signals from the memory test enable circuit 60, which is herein defined in further detail with regard to FIG. 3A. The memory test enable circuit 60 is normally controlled by the write enable signal 31. After enabling the memory test enable circuit 60, a signal from the memory test enable circuit 60 is placed into the write enable register 32. The write enable register 32 outputs a write enable signal upon receiving a signal from the memory write clock 33. The memory write clock 33 inputs the clock signal into the write enable register 32 that outputs a write enable signal into the logic circuitry 36.

The other input into logic circuitry 36 is the output of the memory write register and decoder 35. The memory write register and decoder 35 receives a data signal from the memory write address 34 and the memory write clock 33. Upon receiving the proper signal from the memory write clock 33, the memory write register and decoder 35 outputs a signal into the logic circuitry 36. Upon signals being received from both the write enable register 32 and the memory write register and decoder 35, the logic circuitry 36 inputs a write signal into the memory array 27. Upon receiving this signal, an input data value may be clocked into memory array 27 from memory test input circuit 50.

Memory data may be clocked out of the memory array 27 through the memory read circuitry. The memory read circuitry includes the memory read address 37, the memory read clock 38 and the memory read register and decoder 39. Signals from both the memory read address 37 and memory read clock 38 are input into memory read register and decoder 39. Upon having a valid memory read address 37 and receiving the proper clock signal from the memory read clock 38, the memory read register and decoder 39 instructs the memory array 27 to read out a data value on line 28. The data read out from memory array 27 on line 28 is input into memory test output circuit 70. The memory test output circuit 70 is herein defined in further detail with regard to FIG. 3B.

The output from memory test output circuit 70 is via connection 29 into data selector 42. Data selector 42 also receives data directly from the circuit input port 21 via connection 22. The data selector 42 determines which data is passed on to output data 43 by the indication of the bypass signal 41. If the bypass signal 41 triggers the data selector 42 to form a bypass signal, then the data from circuit input port 21, via line 22, is output through the data selector 42 into the output data 43. This data bypass enables the input data to bypass the memory array when the same location is to be both written into and read from as well.

FIG. 3A is a block diagram illustrating an example of the memory test enable circuit 60 within the memory test logic 40 of the present invention as shown in FIG. 2. The memory test enable circuit 60 receives a signal from the write enable signal 31 into the array test register A 62, the array test register B 63, and the array test multiplexer 64. The array test multiplexer 64 is controlled by the array write test signal 61. The array write test signal 61 is controlled with a signal received from the test port 23. The test port 23 controls (i.e. activates/deactivates) the array write test signal 61, and sets the state of array test registers 62 and 63.

When the array write test signal 61 is activated, the array test multiplexer 64 selects the signal from the array test registers 62 and 63. The memory test enable circuitry 60 has array test registers 62 and 63 to enable a speed test of the memory array 27 (FIG. 2) by controlling the write enable signal 31 on a write cycle into the memory array 27. It is desirable to control the data input, the write address and the write enable signals to perform the speed test.

The data input and write address are controlled on the first of two clock cycles. When the memory test enable circuitry 60 is set for normal operation, the array write test signal 61 indicates that the write enable signal 31 is to be used for the circuitry 20. However, if the array write test signal 61 indicates that there is to be a speed test of the memory array 27, the memory test enable circuitry 60 utilizes the array test registers 62 and 63 to control the write enable signal 31 during both clock cycles of the speed test (FIG. 2). The output of the array test register A 62 is fed into the array test register B 63. The output of the array test register B 63 is input into the array test multiplexer 64.

Figure 3B:
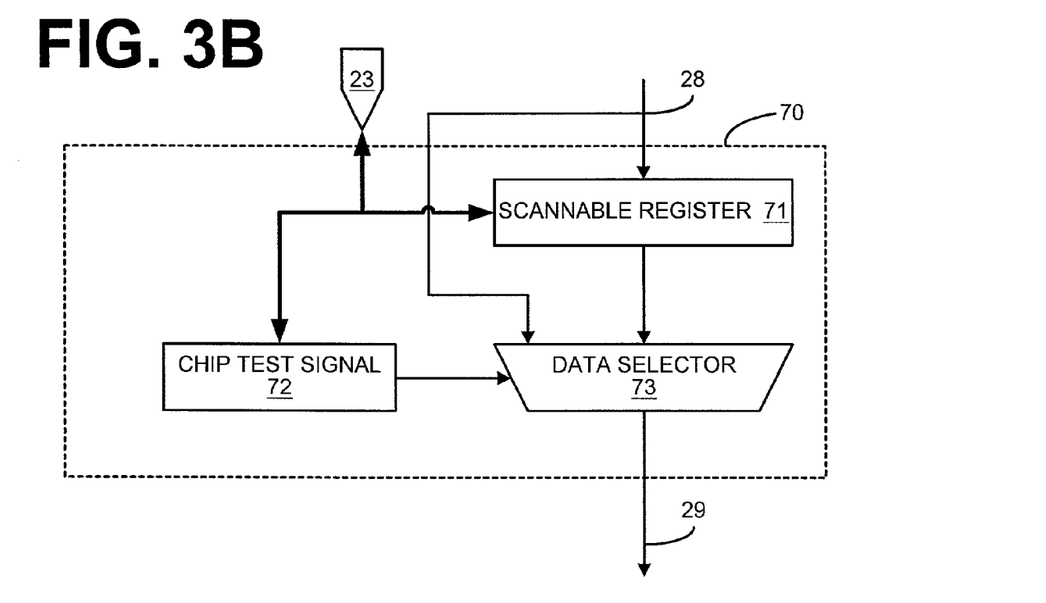
FIG. 3B is a block diagram illustrating an example of the memory test output circuit utilized in the memory test logic as shown in FIG. 2.

FIG. 3B is a block diagram illustrating an example of the memory test output circuit 70 utilized in the memory test logic 40, as shown in FIG. 2. The memory test output circuit 70 includes a scannable register 71 and a data selector 73 that are controlled by the chip test signal 72. The chip test signal 72 is controlled by a signal from test port 23. Data output from the memory array 27 (FIG. 2) is input into the scannable register 71 and directly into the data selector 73. Usage of the chip test signal 72 determines which data signal is output via data selector 73 on line 29. During normal operation, the output data on line 28 (FIG. 2) from the memory array 27 is sent out on line 29. During a chip test, the contents of scannable register 71 are driven out on line 29 instead.

The scannable register 71 captures data being read out of the memory array 27. The scannable register 71 can input data from and output data to test port 23. The scannable register 71 also allows the memory test output circuit 70 to enable logic external to the memory array 27 to be tested. By setting the chip test signal 72, the output of scannable register 71 can drive logic external to the memory array 27 through data selector 73. This allows logic external to the memory array 27 to be tested. This allows the rest of the circuitry 20 to treat the memory array 27 as a black box.

Figure 4:
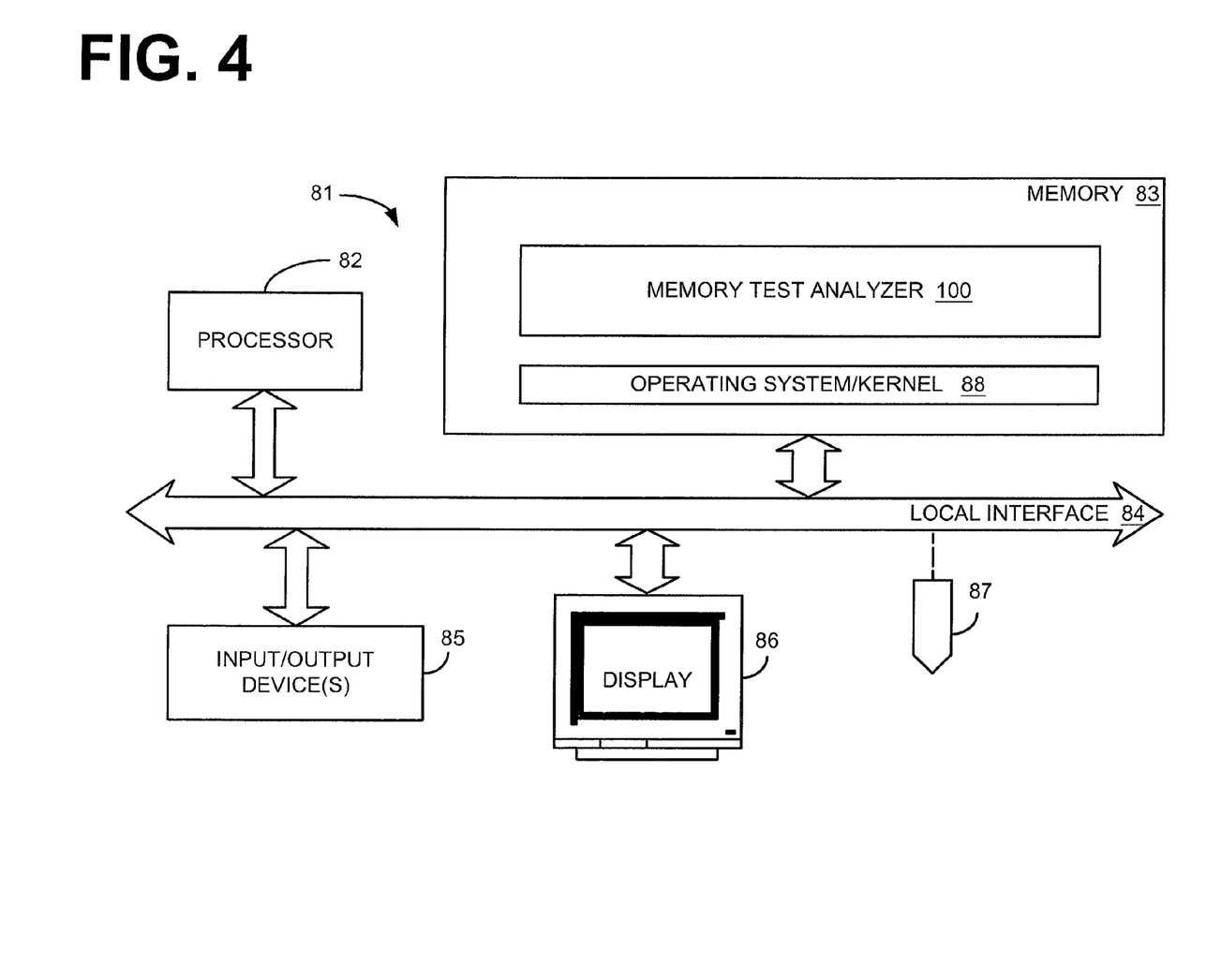
FIG. 4 is a block diagram illustrating a possible implementation of the memory test analyzer of FIG. 1 situated with a computer readable medium.

FIG. 4 is a block diagram illustrating an example of a general-purpose computer 81 that can implement the memory test analyzer 100 of the present invention. The memory test analyzer 100 is shown within a computer readable medium, such as, for example, a memory 83 in a general-purpose computer system 81. Generally, in terms of hardware architecture, as shown in FIG. 4, the computer system 81 includes a processor 82, memory 83, and one or more input devices and/or output (I/O) devices (or peripherals) that are communicatively coupled via a local interface 84.

The local interface 84 can be, for example but not limited to, one or more buses or other wired or wireless connections, as is known in the art. The local interface 84 may have additional elements, which are omitted for simplicity, such as controllers, buffers (caches), drivers, repeaters, and receivers, to enable communications. Further, the local interface 84 may include address, control, and/or data connections to enable appropriate communications among the aforementioned components.

The processor 82 is a hardware device for executing software that can be stored in memory 83. The processor 82 can be virtually any custom made or commercially available processor, a central processing unit (CPU) or an auxiliary processor among several processors associated with the computer system 10, and a semiconductor based microprocessor (in the form of a microchip) or a macroprocessor. Examples of suitable commercially available microprocessors are as follows: an 80×86, Pentium, or Itanium series microprocessor from Intel Corporation, U.S.A., a PowerPC microprocessor from IBM, U.S.A., a Sparc microprocessor from Sun Microsystems, Inc, a PA-RISC series microprocessor from Hewlett-Packard Company, U.S.A., or a 68xxx series microprocessor from Motorola Corporation, U.S.A.

The memory 83 can include any one or combination of volatile memory elements (e.g., random access memory (RAM, such as DRAM, SRAM, etc.)) and nonvolatile memory elements (e.g., ROM, hard drive, tape, CDROM, etc.). Moreover, the memory 83 may incorporate electronic, magnetic, optical, and/or other types of storage media. Note that the memory 83 can have a distributed architecture, where various components are situated remote from one another, but can be accessed by the processor 82.

The software in memory 83 may include one or more separate programs, each of which comprises an ordered listing of executable instructions for implementing logical functions. In the example of FIG. 4, the software in the memory 83 includes an operating system 88, and the memory test analyzer 100.

A non-exhaustive list of examples of suitable commercially available operating systems 88 are as follows: a Windows operating system from Microsoft Corporation, U.S.A., a Netware operating system available from Novell, Inc., U.S.A., an operating system available from IBM, Inc., U.S.A., any LINUX operating system available from many vendors or a UNIX operating system, which is available for purchase from many vendors, such as Hewlett-Packard Company, U.S.A., Sun Microsystems, Inc. and AT&T Corporation, U.S.A. The operating system 88 essentially controls the execution of other computer programs, such as the memory test analyzer 100, and provides scheduling, input-output control, file and data management, memory management, and communication control and related services.

The memory test analyzer 100 may be a source program, executable program (object code), script, or any other entity comprising a set of instructions to be performed. When a source program, then the program is usually translated via a compiler, assembler, interpreter, or the like, which may or may not be included within the memory 83, so as to operate properly in connection with the operating system 88. Furthermore, the memory test analyzer 100 can be written in object oriented programming language, which has classes of data and methods, or (b) a procedure programming language, which has routines, subroutines, and/or functions, for example but not limited to, C, C++, Pascal, BASIC, FORTRAN, COBOL, Perl, Java, and Ada.

The I/O devices 85 may include input devices, for example but not limited to, a keyboard, mouse, scanner, microphone, etc. Furthermore, the I/O devices 85 may also include output devices, for example but not limited to, a printer, display 86, etc. Finally, the I/O devices 85 may further include devices that communicate both inputs and outputs, for instance but not limited to, a modulator/demodulator (modem; for accessing another device, system, or network), a radio frequency (RF) or other transceiver, a telephonic interface, a bridge, a router, etc. The computer system 81 also includes chip interface 87 for use in communicating data with an IC chip. This chip interface 87 enables computer system 81 to access IC chips to be tested.

If the computer system 81 is a PC, workstation, or the like, the software in the memory 83 may further include a basic input output system (BIOS) (omitted for simplicity). The BIOS is a set of essential software routines that initialize and test hardware at startup, start the operating system 88, and support the transfer of data among the hardware devices. The BIOS is stored in ROM so that the BIOS can be executed when the computer system 81 is activated.

When the computer system 81 is in operation, the processor 82 is configured to execute software stored within the memory 83, to communicate data to and from the memory 83 and to generally control operations of the computer 81 pursuant to the software. The memory test analyzer 100, and the operating system 88 are read, in whole or in part, by the processor 82, perhaps buffered within the processor 82, and then executed.

When the memory test analyzer 100, is implemented in software, as is shown in FIG. 4, it should be noted that it can be stored on any computer readable medium for use by or in connection with any computer related system or method. In the context of this document, a computer readable medium is an electronic, magnetic, optical, or other physical device or means that can contain or store a computer program for use by or in connection with a computer related system or method. The memory test analyzer 100, can be embodied in any computer-readable medium for use by or in connection with an instruction execution system, apparatus, or device, such as a computer-based system, processor-containing system, or other system that can fetch the instructions from the instruction execution system, apparatus, or device and execute the instructions.

In the context of this document, a "computer-readable medium" can be any means that can store, communicate, propagate, or transport the program for use by or in connection with the instruction execution system, apparatus, or device. The computer readable medium can be, for example but not limited to, an electronic, magnetic, optical, electromagnetic, infrared, or semiconductor system, apparatus, device, or propagation medium. More specific examples (a nonexhaustive list) of the computer-readable medium would include the following: an electrical connection (electronic) having one or more wires, a portable computer diskette (magnetic), a random access memory (RAM) (electronic), a read-only memory (ROM) (electronic), an erasable programmable read-only memory (EPROM, EEPROM, or Flash memory) (electronic), an optical fiber (optical), and a portable compact disc read-only memory (CDROM) (optical). Note that the computer-readable medium could even be paper or another suitable medium upon which the program is printed, as the program can be electronically captured, via for instance optical scanning of the paper or other medium, then compiled, interpreted or otherwise processed in a suitable manner if necessary, and then stored in a computer memory.

In an alternative embodiment, the memory test analyzer 100 is implemented in hardware. The memory test analyzer 100 can be implemented with any one or a combination of the following technologies, which are each well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc.

Figure 5:
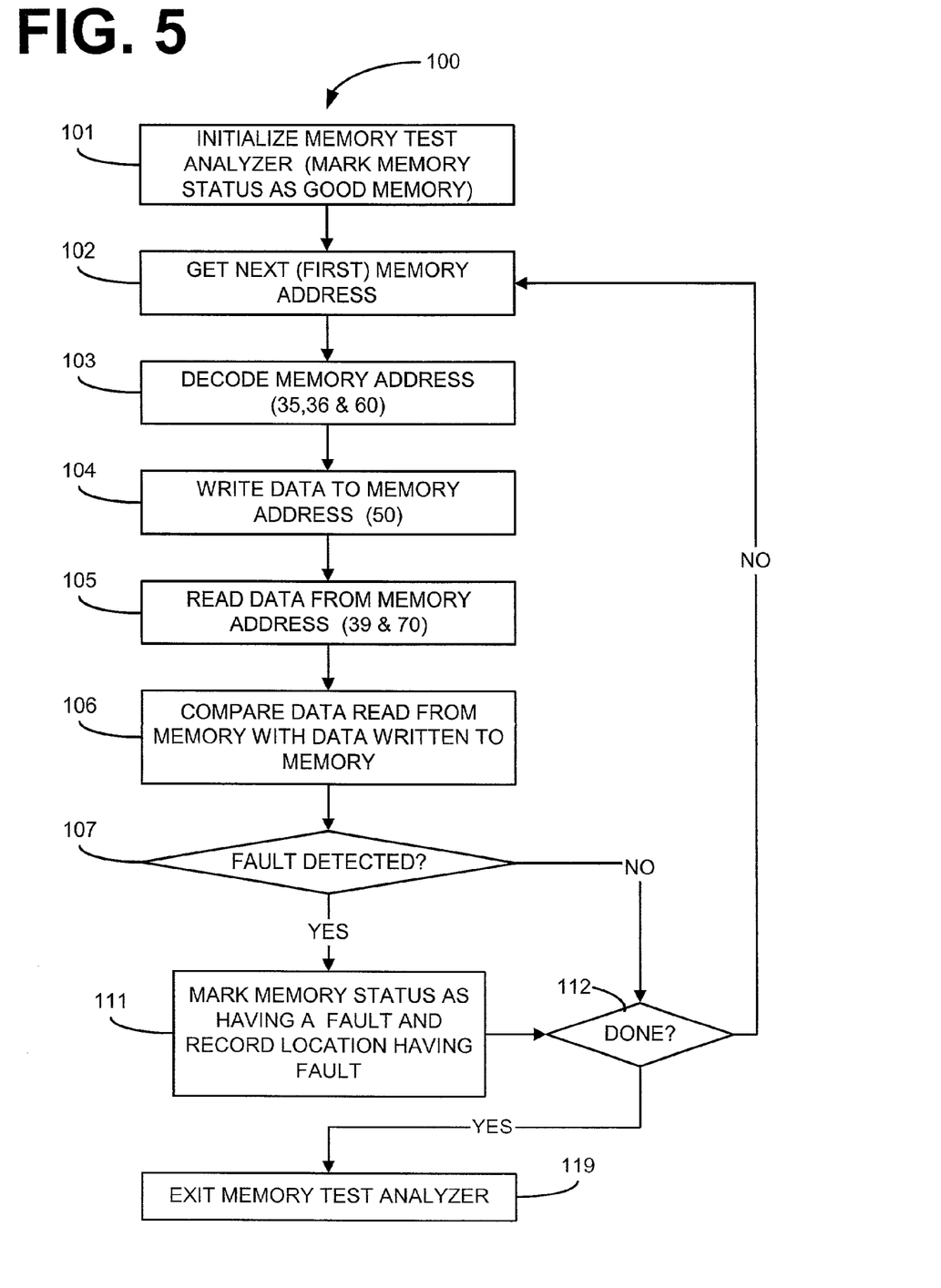
FIG. 5 is a flow chart illustrating a possible implementation of the memory test analyzer that utilizes the memory test logic as shown in FIGS. 1–4.

FIG. 5 is a flow chart illustrating a possible implementation of memory test analyzer 100 of the present invention used in conjunction with the memory test logic 40, as shown in FIGS. 1, 2 and 4. The memory test analyzer 100 enables a design tester to access and test the memory array 27 (FIG. 2). The memory test analyzer 100 also enables the design tester to test logic external to the memory array 27 by observing the data input and controlling the data output from memory array 27 (FIG. 2) into other portions of the circuitry 20 (FIG. 1).

As shown in FIG. 5, the memory test analyzer 100 is initialized and then sets the memory status equal to good at step 101. The memory test analyzer 100 also acquires test data to be used at step 101. This test data may be predetermined or input by a design tester on any input device. At step 102, the memory test analyzer 100 gets the first or next memory address to be tested. Next, the memory test analyzer 100 drives the memory address to be tested into the decode memory address and related circuitry at step 103. The decode memory address and related circuitry includes the write enable register 32, memory write clock 33, memory write decoder 35, logic circuitry 36 and memory test enable circuitry 60, as shown in FIG. 2.

As shown, data is scanned into memory test input circuit 50, a memory address is scanned into the memory write register and decoder 35, and the write enable signal 31 is scanned into write enable register 32. In the preferred embodiment, data is scanned into the circuitry described above using the test port 23 (FIG. 2), that is accessible by the memory test analyzer 100. The test port 23 can connect to circuitry in either serial or parallel modes depending on design requirements. As shown in FIG. 5 at step 104, the memory test analyzer 100 writes the data input from memory test input circuit 50 (FIG. 2) into memory array 27 (FIG. 2) upon receiving a write signal from the write enable register 32.

At step 105, the memory read address is scanned into the memory read register and decoder 39 using the test port 23. The data at the memory read address is then read from the memory array 27 into the scannable register 71 (FIG. 3B) in the memory test output circuit 70 (FIG. 2). The data in the scannable register 71 is then output to the memory test analyzer 100 using test port 23. At step 106, the memory test analyzer 100 compares the data read from the memory array 27 with the data written into memory array 27 from the memory test input circuit 50, via input port 21 and line 22.

At step 107, the memory test analyzer 100 determines if the data input into memory array 27 is different (i.e. a fault is detected), from the data read from memory array 27, via the scannable register 71 and test port 23. If no fault is determined at step 107, the memory test analyzer 100 proceeds to step 112 to determine if there are more memory addresses to be tested. However, if a fault is detected at step 107, then the memory test analyzer 100 proceeds to indicate that the memory location has fault. At step 111, the memory test analyzer 100 marks the memory status at the memory address decoded at step 103 as having a fault. The memory test analyzer 100 records the memory address having the fault and then determines if there are more memory addresses to be tested at step 112.

At step 112, the memory test analyzer 100 determines if there are more memory addresses to be tested. If it is determined that there are more memory addresses to be tested, then the memory test analyzer 100 returns to repeat steps 102–112. However, if it is determined at step 112 that there are no more memory addresses to be tested, the memory test analyzer 100 then exits at step 119.

The foregoing description is not intended to be exhaustive or to limit the invention to the precise forms disclosed. Obvious modifications or variations are possible in light of the above teachings. In this regard, the embodiment or embodiments discussed were chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly and legally entitled.

What is claimed is:

1. A method for testing a memory array in a manufactured chip comprising the steps of:
   providing input data;
   acquiring test data;
   writing the test data to a memory address in the memory array using a memory test enable logic configured to write the test data into the memory address over a period of two clock cycles of a speed test;
   receiving in a scannable register the test data associated with the memory address and capturing the test data;
   reading out the test data from the memory address in the memory array; and
   comparing the test data with the input data to determine if the memory address in the memory array passes the speed test.

2. The method as defined in claim 1, further comprising: selecting the memory address in the memory array.

3. The method as defined in claim 1, wherein the step of comparing further comprises:
   determining that the memory address in the memory array passes a test when the output data equals the test data.

4. The method as defined in claim 3, wherein the determining step further comprises:
   approving the memory address in the memory array as good when the output data equals the test data.

5. The method as defined in claim 3, wherein the determining step further comprises:
   marking the memory address in the memory array as faulty when the output data does not equal the test data.

6. A system for testing a memory array in a manufactured chip comprising:
   means for providing input data;
   means for acquiring test data;
   means for writing the test data to a memory address in the memory array using a memory test enable logic configured to write the test data into the memory address over a period of two clock cycles of a speed test;
   scannable register means for receiving the test data associated with the memory address and capturing the test data;
   means for reading out the test data from the memory address in the memory array; and
   means for comparing the test data with the input data to determine if the memory address in the memory array passes the speed test.

7. The system of claim 6, further comprising:
   means for selecting the memory address in the memory array.

8. The system of claim 6, further comprising:
   means for determining that the memory address in the memory array passes a
   test when the output data equals the test data.

9. The system of claim 8, further comprising:
   means for approving the memory address in the memory array as good when the output data equals the test data.

10. The system of claim 8, further comprising:
    means for marking the memory address in the memory array as faulty when the output data does not equal the test data.

11. The system of claim 6, further comprising:
    means for testing circuitry logic external to the memory array.

12. The system of claim 6, further comprising:
    means for performing a speed test on the memory array.

13. A computer readable storage medium containing program code for testing a memory array in a manufactured chip comprising:
    a first code segment configured to supply input data and test data;
    a second code segment configured to enable the test data to be written to a memory address in the memory array using a memory test enable logic configured to write the test data into the memory address over a period of two clock cycles of a speed test;
    a scannable register for receiving the test data associated with the memory address and capturing the test data;
    a third code segment configured to enable the test data from the memory address to be read; and
    a fourth code segment configured to enable the test data and the input data to be compared to determine if the memory address in the memory array passes the speed test.

14. The program code of claim 13, wherein said second code a segment is further configured to enable the selection of the memory address in the memory array.

15. The program code of claim 14, wherein said fourth code segment is further configured to determine that the memory address in the memory array passes a test when the output data equals the test data.

16. The program code of claim 15, wherein said second code segment is further configured to approve the memory address in the memory array as good when the output data equals the test data.

17. The program code of claim 15, wherein said second code segment is further configured to mark the memory address in the memory array as faulty when the output data does not equal the test data.

18. A memory array test system for testing a memory array in a manufactured chip, comprising:
   a memory test input logic configured to write input data and test data into a memory address;
   a memory test enable logic configured to write the test data into the memory address over a period of two clock cycles of a speed test;
   a memory test output logic including a scannable register configured to receive the test data associated with the memory address and capture the test data; and
   logic to compare the input data written to memory with the test data captured by the scannable register to determine whether the two data elements match.

19. The system of claim 18, wherein the memory test input logic further comprises:
   a controllable input storage circuitry to supply test data.

20. The system of claim 18, wherein the memory test enable logic further comprises:
   logic configured to switch between normal operation and a memory testing operation; and
   logic configured to control when the memory testing operation is operational.

21. The system of claim 20, wherein the memory test enable logic further comprises:
   speed test logic configured to generate a write enable signal of a predetermined 22. The system of claim 18, wherein the memory test output logic further comprises:
   a controllable output storage circuitry that stores data output from a memory array;
   logic configured to switch between a normal operation and an external logic testing operation; and
   logic configured to control when the external logic testing operation is 23. The system of claim 18, wherein the controllable output storage circuitry stores output test data.

24. The system of claim 18, wherein the memory test output logic further comprises:
   a bypass storage circuitry that enables data from the memory array to be output without storage in the controllable output storage circuitry.

25. A memory array test system for testing a memory array in a manufactured chip, comprising:
   a controllable input storage circuitry to supply input data and test data to the memory array;
   a memory test enable circuitry to switch between a normal operation and a memory testing operation of the memory array and configured to write the test data into the memory address over a period of two clock cycles of a speed test;
   a controllable output storage circuitry including a scannable register configured to receive the test data associated with the memory address and capture the test data; and
   logic to compare the input data written to memory with the test data captured by the scannable register to determine whether the two data elements match.

* * * * *

UNITED STATES PATENT AND TRADEMARK OFFICE
CERTIFICATE OF CORRECTION

PATENT NO. : 6,978,406 B2 Page 1 of 1
APPLICATION NO. : 10/155544
DATED : December 20, 2005
INVENTOR(S) : Gayvin Stong It is certified that error appears in the above-identified patent and that said Letters Patent is hereby corrected as shown below:

Col. 11 Line 2 In Claim 14, after "code" delete "a".

Col. 12 Line 4 In Claim 21, after "predetermined" insert -- duration. --.

Col. 12 Line 8 In Claim 22, after "from" delete "a" and insert -- the --, therefor.

Col. 12 Line 12 In Claim 22, after "is" insert -- operational. --.

Signed and Sealed this

Twenty-fourth Day of February, 2009

JOHN DOLL
*Acting Director of the United States Patent and Trademark Office*